(12) United States Patent
Kurunczi et al.

(10) Patent No.: US 9,034,743 B2
(45) Date of Patent: May 19, 2015

(54) METHOD FOR IMPLANT PRODUCTIVITY ENHANCEMENT

(71) Applicant: Varian Semiconductor Equipment Associates, Inc., Gloucester, MA (US)

(72) Inventors: Peter F. Kurunczi, Cambridge, MA (US); Bon-Woong Koo, Andover, MA (US); John A. Frontiero, Rockport, MA (US); William T. Levay, Rockport, MA (US); Christopher J. Leavitt, Gloucester, MA (US); Timothy J. Miller, Ipswich, MA (US); Vikram M. Bhosle, North Reading, MA (US); John W. Graff, Swampscott, MA (US); Nicholas P T Bateman, Reading, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 14/090,001

(22) Filed: Nov. 26, 2013

(65) Prior Publication Data

US 2015/0024580 A1    Jan. 22, 2015

Related U.S. Application Data

(60) Provisional application No. 61/847,776, filed on Jul. 18, 2013.

(51) Int. Cl.
*H01L 21/425* (2006.01)
*H01L 21/265* (2006.01)

(52) U.S. Cl.
CPC .................................. *H01L 21/265* (2013.01)

(58) Field of Classification Search
CPC .......................... H01L 21/265; H01L 21/2658
USPC .............................. 438/514, 527; 250/492.21
See application file for complete search history.

(56) References Cited

U.S. PATENT DOCUMENTS

| 7,655,931 | B2  |    | 2/2010  | Gupta         |            |
|-----------|-----|----|---------|---------------|------------|
| 7,816,656 | B2  | *  | 10/2010 | Krueger et al.| 250/492.21 |
| 8,058,156 | B2  |    | 11/2011 | Hanawa et al. |            |
| 2001/0037817 | A1 |   | 11/2001 | Abbott        |            |
| 2005/0208218 | A1 | * | 9/2005  | Becker et al. | 427/248.1  |
| 2006/0063360 | A1 | * | 3/2006  | Singh et al.  | 438/510    |
| 2008/0179545 | A1 | * | 7/2008  | Perel et al.  | 250/492.21 |

(Continued)

FOREIGN PATENT DOCUMENTS

KR    10-2007-0099987 A    10/2007

OTHER PUBLICATIONS

John W. Graff, et al, Method of Improving Ion Beam Quality in an Implant System, U.S. Appl. No. 14/089,916, filed Nov. 26, 2013.

(Continued)

*Primary Examiner* — Bradley K Smith (57) ABSTRACT

A method of processing a workpiece is disclosed, where the ion chamber is first coated with the desired dopant species and another species. Following this conditioning process, a feedgas, which comprises fluorine and the desired dopant, is introduced to the chamber and ionized. Ions are then extracted from the chamber and accelerated toward the workpiece, where they are implanted without being first mass analyzed. The other species used during the conditioning process may be a Group 3, 4 or 5 element. The desired dopant species may be boron.

14 Claims, 6 Drawing Sheets

(56) References Cited

U.S. PATENT DOCUMENTS

| | | |
|---|---|---|
| 2008/0237496 A1* | 10/2008 | Gupta .................... 250/492.21 |
| 2009/0280628 A1 | 11/2009 | Vellaikal et al. |
| 2011/0143527 A1 | 6/2011 | Platow et al. |
| 2013/0260543 A1 | 10/2013 | Koo et al. |

OTHER PUBLICATIONS

International Search Report and Written Opinion Mailed Jan. 29, 2015 for PCT/US2014/064211 Filed Nov. 6, 2014.

* cited by examiner

METHOD FOR IMPLANT PRODUCTIVITY ENHANCEMENT

This application claims priority of U.S. Provisional Patent Application Ser. No. 61/847,776, filed Jul. 18, 2013, the disclosure of which is incorporated by reference.

FIELD

Embodiments of the present disclosure relate to methods for improving ion beam quality in an ion implantation system, and more particularly, improving boron ion beam quality.

BACKGROUND

Semiconductor workpieces are often implanted with dopant species to create a desired conductivity. For example, solar cells may be implanted with a dopant species to create an emitter region. This implant may be done using a variety of different mechanisms. In one embodiment, an ion source is used. This ion source may include a chamber in which source gasses are ionized. The ions from these source gasses may be extracted through an aperture in the chamber, using one or more electrodes. These extracted ions are directed toward a workpiece, where they are implanted in the workpiece to form the solar cell.

In an effort to improve process efficiency and lower cost, in some embodiments, the ions extracted from the ion source are accelerated directly toward the workpiece, without any mass analysis. In other words, the ions that are generated in the ion source are accelerated and implanted directly into the workpiece. A mass analyzer is used to remove undesired species from the ion beam. Removal of the mass analyzer implies that all ions extracted from the ion source will be implanted in the workpiece. Consequently, undesired ions, which may also be generated within the ion source, are then implanted in the workpiece.

This phenomenon may be most pronounced when the source gas is a halogen-based compound, such as a fluoride. Fluorine ions and neutrals (metastable or excited) may react with the inner surfaces of the ion source, releasing unwanted ions, such as silicon, oxygen, carbon, and aluminum and heavy metals present as impurity elements.

Therefore, a method which improves beam quality, particular for embodiments in which halogen based source gasses are employed, would be beneficial.

SUMMARY

A method of processing a workpiece is disclosed, where the ion chamber is first coated with the desired dopant species and another species. Following this conditioning process, a feedgas, which comprises fluorine and the desired dopant species, is introduced to the chamber and ionized. Ions are then extracted from the chamber and accelerated toward the workpiece, where they are implanted without being first mass analyzed. The other species used during the conditioning process may be a Group 3, 4 or 5 element. The desired dopant species may be boron.

In one embodiment, a method for processing a workpiece is disclosed. The method comprises introducing a conditioning gas into a chamber of an ion source, the conditioning gas comprising a hydride containing a desired dopant species, and a conditioning co-gas, where the conditioning co-gas comprises a noble gas, a hydride of a Group 4 element, or a hydride of a species having an opposite conductivity of the desired dopant species, where between 10% and 40% of a total volume of gas introduced comprises the conditioning co-gas; ionizing the conditioning gas and the conditioning co-gas in the chamber so as to form a coating on walls of the chamber; changing gases introduced into the chamber after the coating is formed and introducing a feedgas into the chamber, the feedgas comprising fluorine and the desired dopant species; ionizing the feedgas in the chamber to create ions; and extracting the ions from the chamber and accelerating the ions toward the workpiece, such that the ions are implanted into the workpiece without mass analysis.

In a second embodiment, a method of processing a workpiece is disclosed, where the method comprises introducing a conditioning gas into a chamber of an ion source, the conditioning gas comprising a borane, and a conditioning co-gas, the conditioning co-gas comprising a hydride of a Group 4 or 5 element; forming a coating on walls of the chamber, wherein the coating comprises boron and the Group 4 or 5 element; introducing a feedgas into the chamber after the coating is formed, the feedgas comprising fluorine and boron; ionizing the feedgas in the chamber to create ions; and extracting the ions from the chamber and accelerating the ions toward the workpiece.

In a third embodiment, a method of processing workpieces is disclosed. This method comprises performing a conditioning process on a chamber of a ion source to coat walls of the chamber with boron and a Group 4 or 5 element; and performing an implantation process after a coating is formed on the walls, wherein a feedgas, comprising fluorine and boron, is ionized to create ions, the ions are extracted from the chamber and accelerated toward the workpieces, and the ions are implanted into the workpieces without mass analysis. In some embodiments, the conditioning process comprises ionizing a conditioning gas comprising a borane and a conditioning co-gas comprising a hydride of the Group 4 or 5 element in the chamber. In some further embodiments, the conditioning co-gas may be phosphine ($PH_3$), arsine ($AsH_3$), germane ($GeH_4$) or silane ($SiH_4$).

BRIEF DESCRIPTION OF THE FIGURES

For a better understanding of the present disclosure, reference is made to the accompanying drawings, which are incorporated herein by reference and in which.

DETAILED DESCRIPTION

As described above, ionization of halogen-based species, such as fluorides, may cause particles released from the inner surfaces of the ion source to be implanted in the workpiece. These contaminants may include aluminum, carbon, nitrogen, oxygen, silicon, fluorine-based compounds, and other unwanted species (including heavy metals present as impurity elements). One approach to address the damage caused by free halogen ions may be to introduce a second source gas during implantation.

Figure 1A:
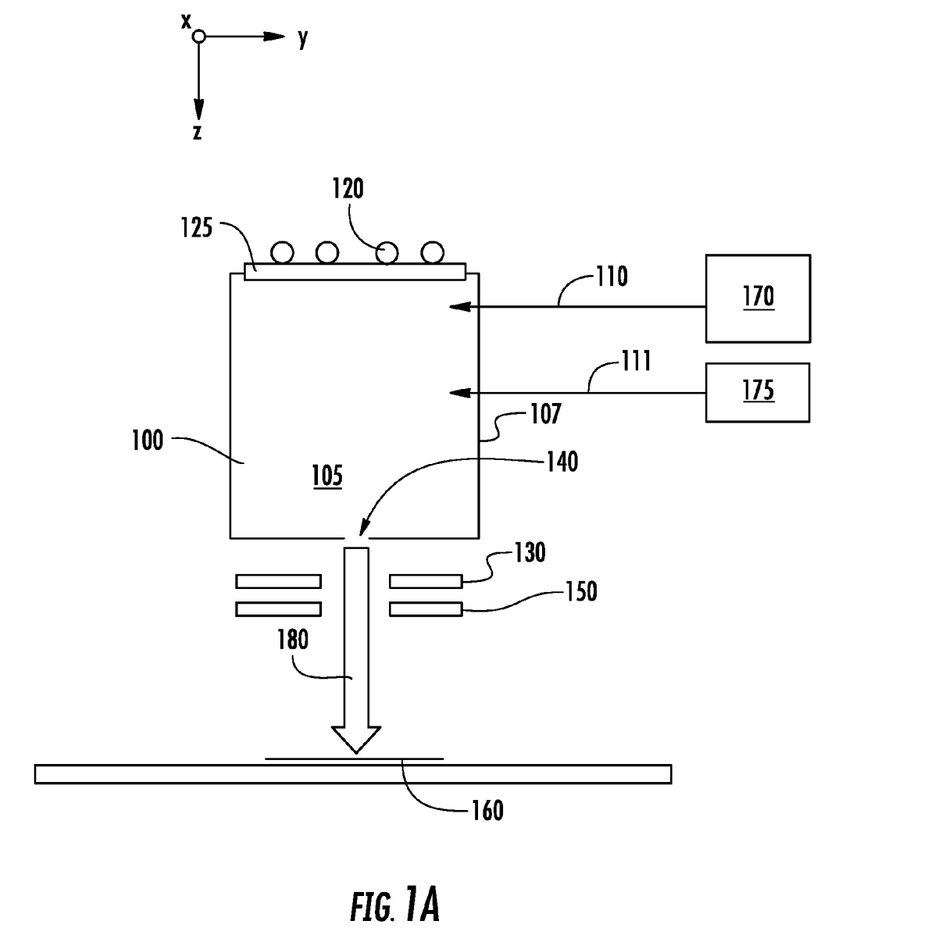
FIGS. 1A-1C show the implant system according to different embodiments.
Figure 1B:
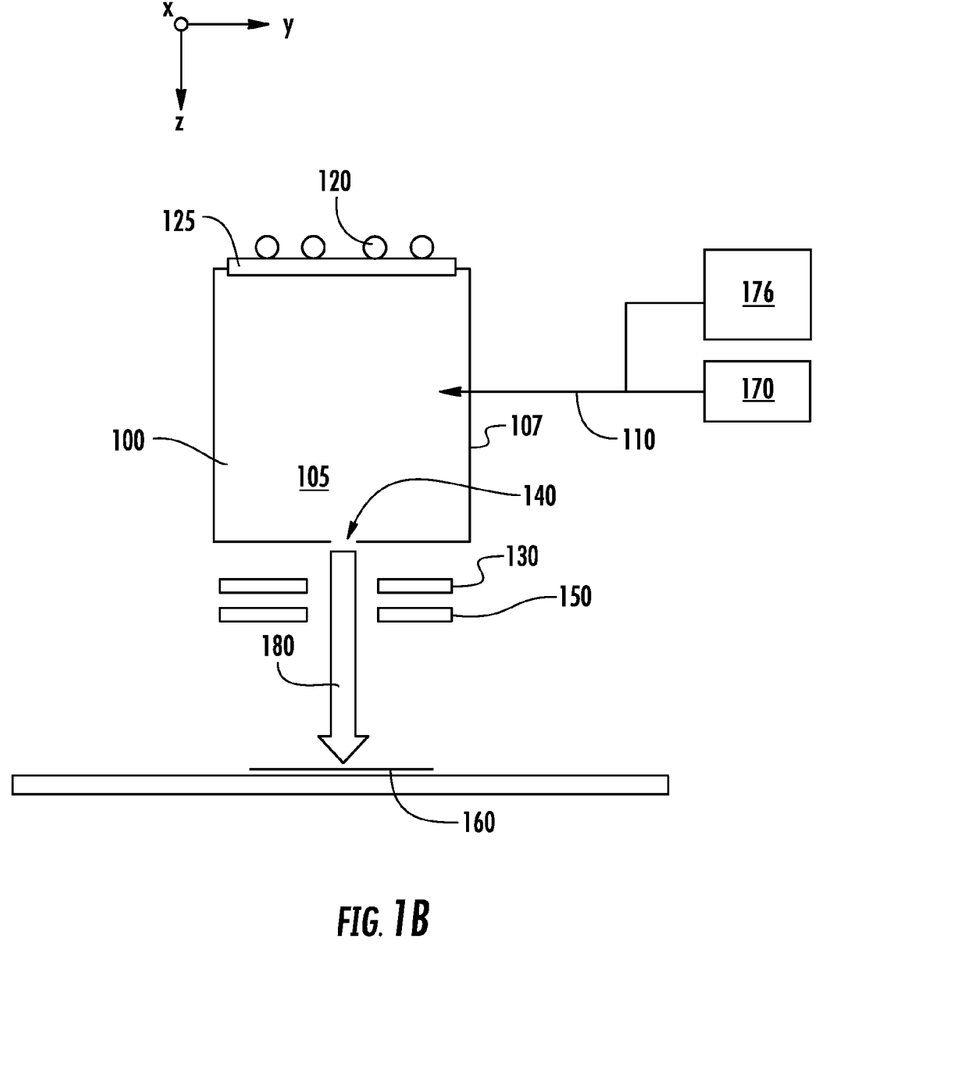
Figure 1C:
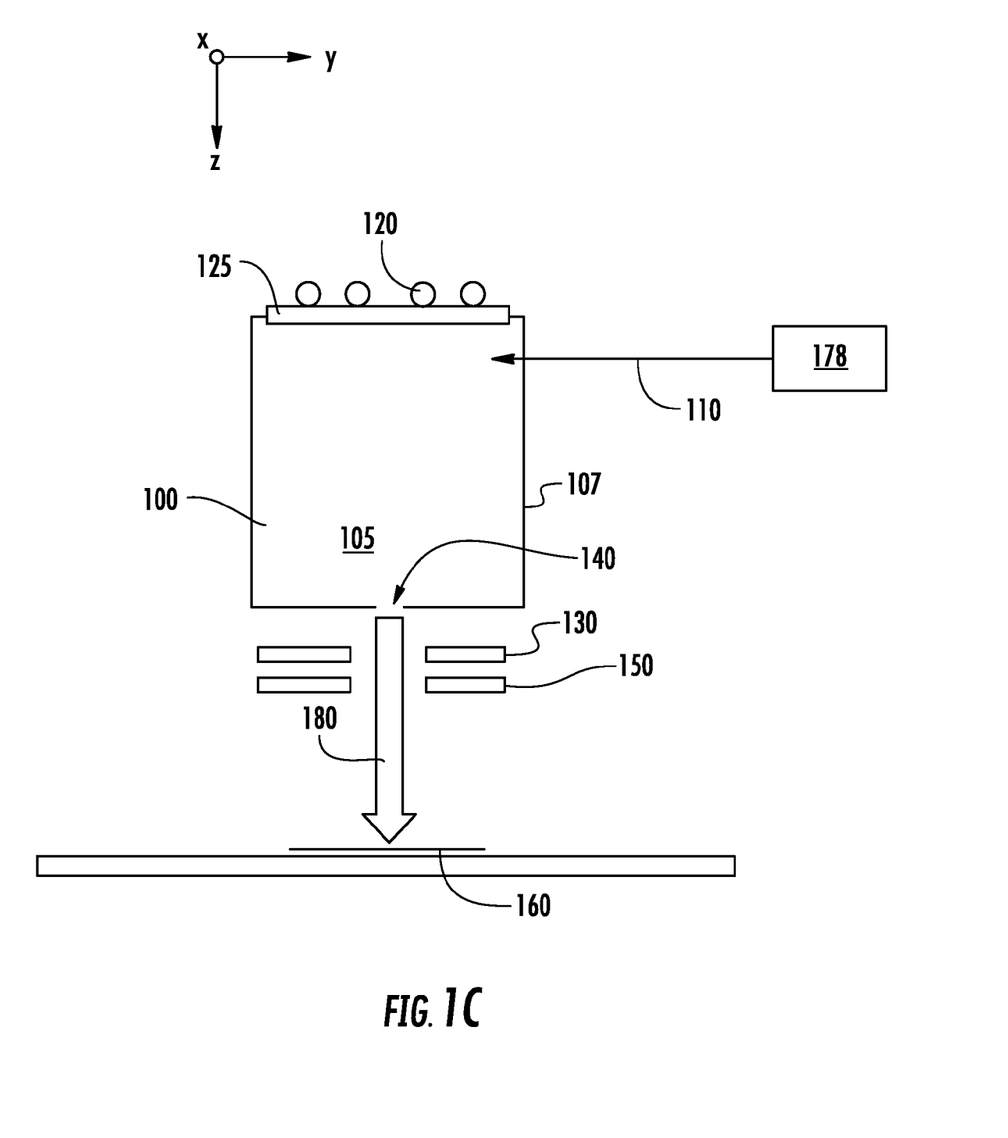

FIGS. 1A-1C show various embodiments in which a second source gas may be introduced to a chamber 105 of an ion source 100. In each of these figures, the ion source 100 includes a chamber 105 defined by several plasma chamber walls 107, which may be constructed from graphite or another suitable material. This chamber 105 may be supplied with one or more source gasses, stored in a source gas container 170, via a gas inlet 110. This source gas may be energized by an RF antenna 120 or another mechanism. The RF antenna 120 is in electrical communication with a RF power supply (not shown) which supplies power to the RF antenna 120. A dielectric window 125, such as a quartz or alumina window, may be disposed between the RF antenna 120 and the interior of the ion source 100. The ion source 100 also includes an aperture 140 through which ions may pass. A negative voltage is applied to extraction suppression electrode 130 disposed outside the aperture 140 to extract the positively charged ions from within the chamber 105 through the aperture 140 and toward the workpiece 160. A ground electrode 150 may also be employed. In some embodiments, the aperture 140 is located on the side of the ion source 100 opposite the side containing the dielectric window 125. Ions extracted from the chamber 105 are formed into an ion beam 180, which is directed toward the workpiece 160. As described above, no mass analyzer is used to filter the ions before they strike the workpiece 160. In one particular embodiment, shown in FIG. 1A, the second source gas may be stored in a second gas container 175 and introduced to the chamber 105 through a second gas inlet 111. In another embodiment, shown in FIG. 1B, the second source gas may be stored in a second gas container 176 and introduced to the chamber 105 through the same gas inlet 110 used by the first source gas. In yet another embodiment, shown in FIG. 1C, the second source gas may be mixed with the first source gas in a single gas container 178. This mixture of gasses is then introduced to the chamber 105 through gas inlet 110.

In any of these embodiments, the first source gas and the second source gas may be introduced simultaneously or sequentially to the chamber 105.

The first source gas, also referred to as the feed gas, may comprise a dopant, such as boron, in combination with fluorine. Thus, the feed gas may be in the form of $DF_n$ or $D_mF_n$, where D represents the dopant atom, which may be boron, gallium, phosphorus, arsenic or another Group 3 or Group 5 element. The second source gas, also referred to as the diluent gas, may be a molecule having a chemical formula of $XH_n$ or $X_mH_n$, where H is hydrogen. X may be a dopant species, such as any of those described above. Alternatively, X may also be an atom that does not affect conductivity of the workpiece 160. For example, if the workpiece 160 comprises silicon, X may be a Group 4 element, such as silicon and germanium.

In other words, the feedgas may be $BF_3$ or $B_2F_4$, while the diluent gas may be, for example, $PH_3$, $SiH_4$, $NH_3$, $GeH_4$, $B_2H_6$, or $AsH_3$. This list represents some possible species that may be used. It is understood that other feedgas species and diluent species are also possible.

By combining the feedgas with the diluent gas, the deleterious effects of the fluorine ions may be reduced. For example, without being limited to any particular theory, the introduction of hydrogen may create a film or coating on the dielectric window 125. This serves to protect the dielectric window 125, which reduces the amount of contaminants originating from the dielectric window 125 that are contained in the extracted ion beam 180. In addition, the diluent gas may coat the inner surfaces of the plasma chamber walls 107, which may be another source of contaminants. This coating may reduce the interaction between fluorine ions and the inner surfaces of the plasma chamber walls 107, reducing the amount of contaminants generated.

The introduction of a diluent gas may reduce the creation of contaminants and the incorporation of these contaminants in the ion beam. Conversely, the introduction of a large amount of diluent gas may negatively impact the production of dopant ions to be used in the ion beam. For example, the introduction of an excessive amount of diluent gas may reduce the dopant beam current created by the ion source. Additionally, an excessive amount of diluent gas containing hydrogen can cause etching and therefore additional contamination. Hydrogen is known to etch certain materials. For example, hydrogen may react with graphite walls, causing $CH_x$ gas to be produced.

Unexpectedly, it has been determined that contaminant reduction does not decrease proportionally with increased diluent concentration. In other words, if the amount of diluent is increased above a certain threshold, the ratio of contaminant current to dopant current actually increases. This may be caused by the fact that above a certain threshold, the additional coating on the inner surfaces of the plasma chamber walls 107 provides little or no additional protection against fluorine ions. Additionally, plasma parameters, such as high plasma potential, will be changed with high diluent gas percentage, which may cause additional sputtering of the chamber walls by diluent gas ions. In addition, a high diluent gas percentage may cause etching of the wall material, therefore adding contamination. The additional sputtering of the chamber walls can cause increased contamination level. Thus, if the dopant current decreases as a function of diluent concentration, and contaminant concentration remains constant or increases after a certain threshold, the percentage of contaminant in the ion beam necessarily increases.

Figure 2:
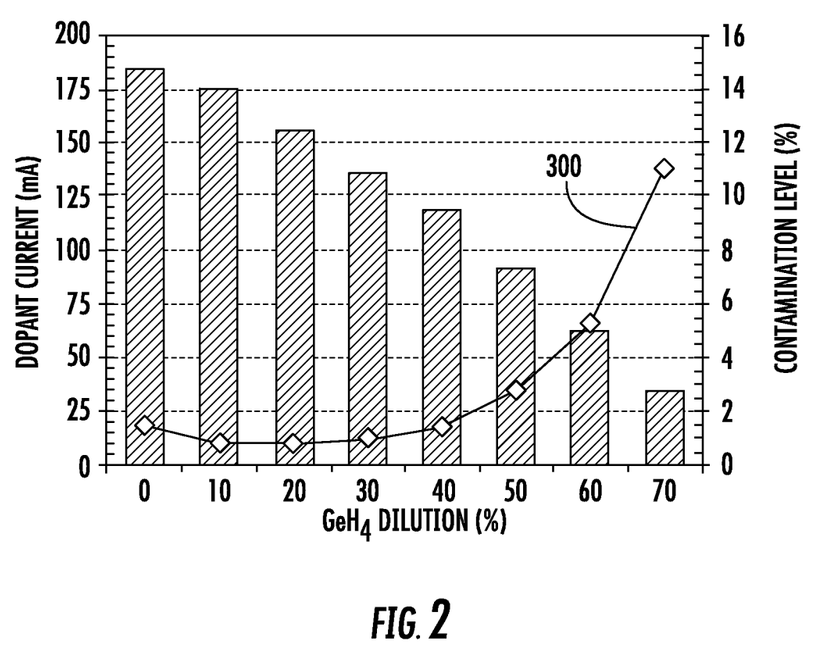
FIG. 2 is a representative graph of dopant current and contaminant level as a function of diluent gas concentration.

FIG. 2 shows a representative graph, showing the effects of diluent gas concentration on both dopant beam current and the percentage of contaminant as compared to dopant in the ion beam. As described above, the contaminant may be an ion species containing silicon, nitrogen, oxygen, hydrogen, aluminum, carbon, carbon-based compounds, fluorine, fluorine-based compounds, or other non-dopant species.

As can be seen in FIG. 2, the dopant current, which is represented by the bar graph, is greatest when no diluent is present. There is a nearly linear reduction in dopant current as the concentration of diluent gas, which in this example is $GeH_4$, is increased. Although this graph shows a particular relationship between dopant current and diluent concentration, it is noted that this relationship may be specific to the test conditions used. For example, a different diluent gas, a different RF power level, or a different pressure (or flow rate) inside the plasma chamber may create different results. Thus, this bar graph is intended to represent a general trend between dopant current and diluent concentration.

Line 300 shows a measure of beam impurity, defined as percentage of a particular contaminant compared to dopant in the ion beam, where the contaminant may be one of those identified above. As expected, the beam impurity decreases as the diluent concentration is increased from 0% to 10%. As stated above, this may be due to the coating action of the hydrogen in the diluent gas. It may be possible that the other species in the diluent gas may affect the coating action. For example, in the case of GeH4, hydrogen molecules are light, therefore may pumped out quickly. However, $GeH_4$ is a heavy molecule with hydrogen attached, therefore may have long transit time and high possibility to react with chamber surfaces and coat these surfaces. For example, compounds having a composition, $GeH_x$, may coat the wall, thus protecting the wall material from fluorine etching. However, unexpectedly, the beam impurity stays relatively flat until the diluent concentration reaches about 30%. In other words, despite the introduction of more diluent gas, the amount of contaminant relative to the amount of dopant remains relatively constant. Throughout the range from about 5% to 30%, the beam impurity is less than about 1%. Surprisingly, if the diluent concentration is increased beyond about 30%, the beam impurity increases rather dramatically, reaching levels in excess of 5% if the gas mixture is 60% diluent gas. Beam impurity may be minimized when the concentration of diluent gas is between 5% and 30%.

FIGS. 1A-1C utilize an ion source having a RF antenna 120 and an RF power supply to generate the necessary ions. However, it can be appreciated that other types of ion sources may be used including IHC, hollow-cathode, helicon, and microwave ion source. For example, an indirectly heated cathode (IHC) which uses heat to cause thermionic emission of electrons may also be used in some embodiments. Other ion sources are also within the scope of the disclosure.

Thus, an extracted ion beam 180 having reduced beam impurity can be created by using two source gasses. The first source gas, or feedgas, may be a species than contains both boron and fluorine, such as $BF_3$ or $B_2F_4$. The second source gas, or diluent, may be a species that contains hydrogen and either silicon or germanium, such as silane ($SiH_4$) or germane ($GeH_4$). These two source gasses are introduced into a chamber 105 of an ion source 100, either simultaneously or sequentially, where they are ionized. The ion source may use RF energy generated by RF antenna 120. In another embodiment, the ion source may utilize the thermionic emission of electrons using an IHC. Other methods of ionizing a gas may also be used by the ion source. These two source gasses may be introduced such that between 5%-30% of the total gas (by volume) is diluent gas, while the remainder is feedgas. Ions from both source gasses are extracted through aperture 140 through use of electrodes 130, 150 and accelerated toward a workpiece 160, where they are implanted into the workpiece 160. As described earlier, these ions may not be mass analyzed, meaning that all extracted ions are implanted into the workpiece 160.

In another example, the diluent gas may include a dopant having the opposite conductivity. For example, the first source gas, or feedgas, may be a species than contains both boron and fluorine, such as $BF_3$ or $B_2F_4$. The second source gas, or diluent, may be a species that contains hydrogen and a Group 5 element, such as phosphorus, nitrogen or arsenic.

The above disclosure discusses diluent ranges between about 5%-30% of the total volume of gas. However, in some embodiments, this range may different. For example, in some embodiments, the diluent concentration may be up to 10%, such as 1-10%, 2-10%, 3-10% or 5-10%. In another embodiment, the diluent concentration may be up to 15%, such as 1-15%, 2-15%, 3-15%, 5-15%, or 7-15%. In another embodiment, the diluent concentration may be up to 20%, such as 2-20%, 3-20%, 5-20%, 7-20%, or 10-20%. In another embodiment, the diluent concentration may be up to 30%, such as 3-30%, 5-30%, 7-30%, 10-30% or 15-30%. In another embodiment, the diluent concentration may be up to 40%, such as 3-40%, 5-40%, 7-40%, 10-40%, 15-40% or 20-40%. In another embodiment, the diluent concentration may be up to 50%, such as 5-50%, 7-50%, 10-50%, 15-50%, 20-50%, or 25-50%. Finally, in another embodiment, the diluent concentration may be as high as 60%, such as 5-60%, 7-60%, 10-60%, 15-60%, 20-60%, 25-60% or 30-60%.

The above description details the use of a diluent gas with the feedgas to create to a plasma used to generate ions to be implanted in a workpiece using a non-mass analyzed ion beam. However, other techniques may also be used in addition to, or in lieu of, this method.

For example, in one embodiment, the inner surfaces of the plasma chamber walls 107 of the ion source 100 may be conditioned prior to the implant process. Conditioning is a process where material is coated onto the inner surfaces of these plasma chamber walls 107. This material may serve to protect the plasma chamber walls 107 from the deleterious effects of halogens, reducing the amount of contaminants that are etched from these plasma chamber walls 107 and introduced into the extracted ion beam.

Conditioning may be performed in a number of ways. In a first embodiment, conditioning is performed in the same manner as implantation. In other words, a plasma is generated within chamber 105 using energy from the RF antenna 120 or other plasma generator. Ions from that plasma are then extracted from the chamber 105 through application of bias voltages to the electrodes 130, 150. During this time, ions from the plasma that are not extracted may be deposited on the plasma chamber walls 107 of the chamber 105, as well as the dielectric window 125.

In a second embodiment, the bias voltages are not applied to the electrodes 130, 150. In this way, the plasma and the ions remain within the chamber 105. Again, ions from the plasma may be deposited on the plasma chamber walls 107 of the chamber 105.

In either embodiment, the generation of this plasma produces ions, some of which attach to the inner surfaces of the plasma chamber walls 107, creating a coating on those surfaces. This conditioning process may be performed for about 60 minutes, although the amount of time is not limited by this disclosure. In other embodiments, this conditioning process may be performed until a coating of a certain thickness has been created.

In some embodiments, a hydride containing the desired dopant species is used to condition the plasma chamber walls 107. The desired dopant species may be the dopant that is to be used during the subsequent implantation process. In other words, in scenarios where the feedgas includes boron, which is to be implanted into the workpieces during the implant process, a borane may be used as the conditioning gas during the conditioning process. This borane may be diborane ($B_2H_6$), pentaborane ($B_5H_9$), decaborane ($B_{10}H_{14}$), or any other borane. If a different dopant is to be implanted, a different hydride may be used as the conditioning gas.

In addition, a conditioning co-gas may be used with this hydride. In some embodiments, the conditioning co-gas may be a noble gas, such as helium, argon, krypton or xenon. In other embodiments, the conditioning co-gas may be a hydride containing a Group 4 element, such as but not limited to silicon (i.e. silane, $SH_4$) or germanium (i.e. germane, $GH_4$). In yet other embodiments, the conditioning co-gas may be a hydride containing a species of the opposite conductivity as the desired dopant. In other words, if the feedgas contains boron, a hydride containing a Group 5 element may be used as the conditioning co-gas. The conditioning co-gas, in this scenario, may be phosphine ($PH_3$) or arsine ($AsH_3$).

The amount of conditioning co-gas may be varied. For example, in some embodiments, the conditioning co-gas may be between 10-40% of the total gas introduced into the chamber 105. In other embodiments, the conditioning co-gas may be between 20-40% of the total gas. In yet other embodiments, the conditioning co-gas may be about 30% of the total gas introduced during the conditioning process.

In one specific example, $BF_3$ or $B_2F_4$ is used as the feedgas to implant the workpiece. To condition the plasma chamber walls 107 of the ion source 100, diborane may be used with a conditioning co-gas. This conditioning co-gas may be, for example, a noble gas, such as helium, argon, krypton or xenon; a Group 4 hydride, such as SH$_4$ or GeH$_4$; or a Group 5 hydride, such as PH$_3$ or AsH$_3$. Of course, this list is not exhaustive and other molecules may be used as the conditioning co-gas during the conditioning process.

Surprisingly, the addition of a conditioning co-gas during the conditioning process significantly affects the quality of the subsequent implantation. For example, in one test, a conditioning process was performed on an ion source using only diborane as the conditioning gas. This conditioning was performed for 1 hour. After conditioning, a feedgas, such as B$_2$F$_4$, was used with a RF power of about 3 KW, to create a plasma in the chamber 105, and workpieces were implanted with a boron-based ion beam. Additionally, 10% of the total gas introduced during the implantation process was a diluent gas comprising GeH$_4$. In this test, an extraction energy of 10 keV was used. While the workpieces were being implanted, an analysis of the ion beam was performed. It was found that after less than 2 hours of implantation with B$_2$F$_4$ using 10% GeH$_4$ as a diluent gas, the contaminants, as a percentage of the total beam current, were greater than 1%. This can be seen graphically in FIG. 3A, where line 400 represents the percentage of contaminants in the ion beam. Contaminants include, but are not limited to, carbon, nitrogen, oxygen, fluorine, aluminum and compounds containing any of these elements.

In a second test, conditioning was performed using a combination of conditioning gas (diborane) and a conditioning co-gas (germane). This conditioning was also performed for 1 hour. Again, after conditioning, a feedgas, such as B$_2$F$_4$ with 10% GeH$_4$ diluent gas, was used to create a plasma in the chamber 105, and workpieces were implanted with a boron-based ion beam. While the workpieces were being implanted, an analysis of the ion beam was performed. Unlike the first results, in this case, even after 9 hours of continuous operation, the level of contaminants was still <1% of the total beam current. This is shown graphically in FIG. 3B, where line 410 represents the percentage of contaminants in the ion beam.

In operation, a conditioning cycle is first performed to coat the plasma chamber walls 107 of the ion source 100 with a material. As described above, in some embodiments, the coating is a boron-based material, which is produced by introducing a borane, such as diborane, into the chamber 105. This conditioning gas is then energized into a plasma, and ions from that plasma attach to and coat the plasma chamber walls 107 of the chamber 105. As described above, to improve the thickness and quality of the conditioning process, a conditioning co-gas may be used with the borane. This conditioning co-gas may be a noble gas, such as helium, argon, krypton or xenon. In other embodiments, this conditioning co-gas may be a hydride containing a Group 5 element, such as PH$_3$ or AsH$_3$. In other embodiments, this conditioning co-gas may be a hydride of a Group 4 element. This conditioning co-gas may be introduced at least partly simultaneously with the borane.

This conditioning process serves to coat the plasma chamber walls 107 so that impurities and other contaminants found in the plasma chamber walls 107 are isolated from the plasma. This coating contains the dopant found in the conditioning gas, which may be a Group 3 element, such as boron. The coating may also contain molecules found in the conditioning co-gas, such as Group 4 elements, such as germanium or silicon; or Group 5 elements, such as phosphorus or arsenic. A sufficient thickness of coating may be applied. The duration of the condition procedure may be based on elapsed time, such as a 1-hour conditioning cycle, or may be based on measured thickness of the coating as it accumulates on the plasma chamber walls 107.

The gasses supplied to the chamber 105 are then changed to those that are to be used during the implantation process. Specifically, the feedgas is introduced. The conditioning gas and conditioning co-gas may or may not continue to be introduced into the chamber 105. As described above, this feedgas may be a molecule that contains the dopant and fluoride, such as BF$_3$ or B$_2$F$_4$, although other gasses may also be used. It should be noted that the dopant used in the implantation process may be the same as described above regarding the conditioning process. Additionally, a diluent gas may be supplied to the chamber 105 during the implantation process. This diluent gas may be a hydride containing a Group 3, 4 or 5 element, such as, but not limited to B$_2$H$_6$, GeH$_4$, SH$_4$, PH$_3$, AsH$_3$. As stated above, in the scenario where the desired dopant species is a Group 3 element, the diluent gas may comprise a Group 4 or Group 5 element. In some embodiments, the diluent gas and the conditioning co-gas may be the same gas. In other embodiments, the diluent gas and the conditioning gas may be the same gas. In yet other embodiments, the diluent gas may include both the conditioning gas and the conditioning co-gas. The implant gasses are then energized into a plasma, and extracted by applying a bias voltage to electrodes 130. The extracted ions are then directed toward a workpiece, where they are implanted without first being mass analyzed.

Figure 3:
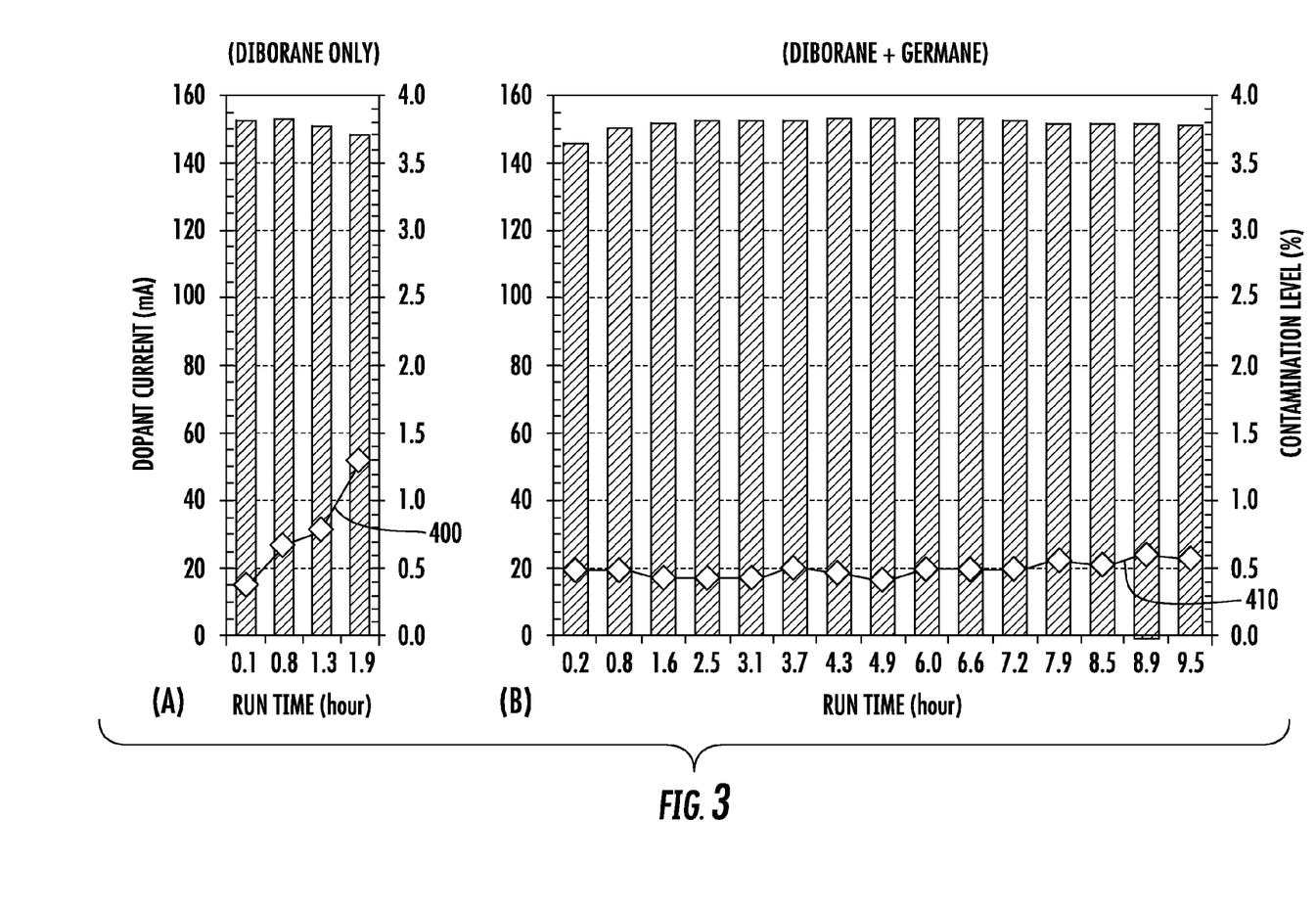
FIGS. 3A-3B show contaminants as a percentage of overall beam current using two different conditioning procedures.
Figure 4:
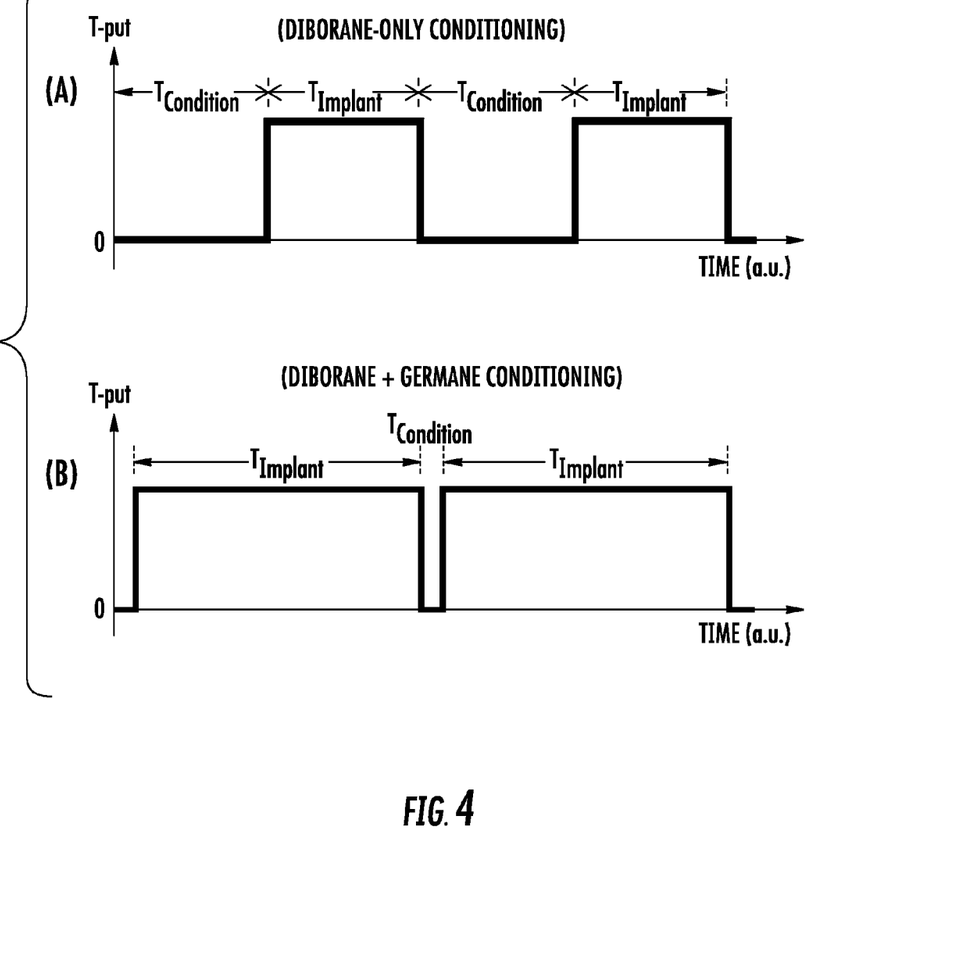
FIGS. 4A-4B demonstrate the difference between two condition procedures.

This implantation process is used for a plurality of workpieces 160 and may continue for a specific time period, or may be terminated when the level of contaminants in the extracted ion beam reaches a predetermined level. For example, the implantation process may continue until the level of contaminants reaches about 1% of the total beam current, although other contamination levels may be selected. FIGS. 4A-4B show a comparison of two different conditioning processes. In the first embodiment, shown in FIG. 4A, conditioning is performed using only diborane as the conditioning gas. Conditioning is performed for one hour and then implantation process is commenced. The implantation process ends when the level of contaminants reaches a predetermined level, such as 1%. As can be seen, this results in a duty cycle of about 50%, where roughly the same amount of time is spent conditioning the chamber 105, as is spent implanting workpieces. In the second embodiment, shown in FIG. 4B, conditioning is performed using diborane with a conditioning co-gas, which, in this example, may be germane. As shown in FIG. 3B, this combination resists the deleterious effects of the halogen and allows longer implantation times. In this particular example, the conditioning process was performed for 1 hour, and the implantation process was then performed for about 9 hours. After 9 hours, the level of contaminants was the equal to or less than the predetermined level. In other words, the duty cycle in this particular embodiment, which is defined as the time spent implanting divided by the total time is about 90%. This difference in duty cycle is very significant. Stated differently, in a 10 day period, at a duty cycle of 90%, implantation would be performed for about 216 hours. In contrast, using a 50% duty cycle, it would take 18 days to achieve the same duration of implantation. This directly translates to operational efficiency and the cost of each workpiece. This example is illustrative and the results may differ with the selection of different gasses and/or implant energies.

The ability to use these various gasses and co-gasses in an ion implantation system that does not utilize mass analysis is surprising, as all ions that are generated within the chamber 105 are ultimately implanted in the workpiece. The ability to use species other than the dopant species during both the conditioning process and the implantation process, without deleterious effects to the workpiece, is unexpected.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of processing a workpiece, comprising:
introducing a conditioning gas into a chamber of an ion source, said conditioning gas comprising a hydride containing a desired dopant species, and a conditioning co-gas, where said conditioning co-gas comprises a noble gas, a hydride of a Group 4 element, or a hydride of a species having an opposite conductivity of said desired dopant species, where between 10% and 40% of a total volume of gas introduced comprises said conditioning co-gas;
ionizing said conditioning gas and said conditioning co-gas in said chamber so as to form a coating on walls of said chamber;
changing gases introduced into said chamber after said coating is formed and introducing a feedgas into said chamber, said feedgas comprising fluorine and said desired dopant species;
ionizing said feedgas in said chamber to create ions; and
extracting said ions from said chamber and accelerating said ions toward said workpiece, such that said ions are implanted into said workpiece without mass analysis.

2. The method of claim 1, wherein said desired dopant species comprises boron.

3. The method of claim 2, wherein said conditioning co-gas comprises a hydride of a Group 4 element.

4. The method of claim 2, wherein said conditioning co-gas comprises a hydride of a Group 5 element.

5. The method of claim 2, wherein said conditioning co-gas comprises a noble gas.

6. A method of processing a workpiece, comprising:
introducing a conditioning gas into a chamber of an ion source, said conditioning gas comprising a borane, and a conditioning co-gas, said conditioning co-gas comprising a hydride of a Group 4 or 5 element;
forming a coating on walls of said chamber, wherein said coating comprises boron and said Group 4 or 5 element;
introducing a feedgas into said chamber after said coating is formed, said feedgas comprising fluorine and boron;
ionizing said feedgas in said chamber to create ions; and
extracting said ions from said chamber and accelerating said ions toward said workpiece.

7. The method of claim 6, wherein said ions are implanted into said workpiece without mass analysis.

8. The method of claim 6, wherein a diluent gas is introduced into said chamber with said feedgas, said diluent gas comprising a hydride of a Group 4 or 5 element, and said method further comprises ionizing said diluent gas with said feedgas in said chamber to create ions.

9. The method of claim 6, wherein said coating is formed by ionizing said conditioning gas and said conditioning co-gas in said chamber.

10. A method of processing workpieces, comprising:
performing a conditioning process on a chamber of a ion source to coat walls of said chamber with boron and a Group 4 or 5 element; and
performing an implantation process after a coating is formed on said walls, wherein a feedgas, comprising fluorine and boron, is ionized to create ions, said ions are extracted from said chamber and accelerated toward said workpieces, and said ions are implanted into said workpieces without mass analysis.

11. The method of claim 10, wherein said conditioning process comprises ionizing a conditioning gas comprising a borane and a conditioning co-gas comprising a hydride of said Group 4 or 5 element in said chamber.

12. The method of claim 11, wherein said conditioning co-gas comprises phosphine ($PH_3$) or arsine ($AsH_3$).

13. The method of claim 11, wherein said conditioning co-gas comprises germane ($GeH_4$) or silane ($SiH_4$).

14. The method of claim 10, wherein said extracted ions form an ion beam, said method further comprising repeating said conditioning process if a percentage of contaminants in said ion beam exceeds a predetermined threshold.

* * * * *